(12) United States Patent
Li et al.

(10) Patent No.: US 9,871,341 B2
(45) Date of Patent: Jan. 16, 2018

(54) LASER ON SILICON MADE WITH 2D MATERIAL GAIN MEDIUM

(71) Applicant: INTERNATIONAL BUSINESS MACHINES CORPORATION, Armonk, NY (US)

(72) Inventors: Ning Li, White Plains, NY (US); Devendra K. Sadana, Pleasantville, NY (US); Jinghui Yang, Los Angeles, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/156,614

(22) Filed: May 17, 2016

(65) Prior Publication Data

US 2017/0338621 A1    Nov. 23, 2017

(51) Int. Cl.
*H01S 5/02*        (2006.01)
*H01S 5/04*        (2006.01)
*H01S 5/34*        (2006.01)

(52) U.S. Cl.
CPC .............. *H01S 5/021* (2013.01); *H01S 5/041* (2013.01); *H01S 5/34* (2013.01)

(58) Field of Classification Search
CPC .............. H01S 5/021; H01S 5/041; H01S 5/34
See application file for complete search history.

(56) References Cited

U.S. PATENT DOCUMENTS

| | | | | |
|---|---|---|---|---|
| 5,825,799 A | * | 10/1998 | Ho ........................ | B82Y 20/00 372/108 |
| 2002/0075929 A1 | * | 6/2002 | Cunningham ......... | B82Y 20/00 372/50.1 |

OTHER PUBLICATIONS

Ye et al. "Monolayer excitonic laser," nature photonics letters, Oct. 19, 2015, p. 1-5.*
del Valle et al. "Photonic band gap in 1d multilayers made by alternating SiO2 or PMMA with MoS2 or WS2 monolayers," Optical Materials, 48, 2015, pp. 267-270.*
Liu et al. "Control of Two-Dimensional Excitonic Light Emission via Photonic Crysta," Apr. 2014, 2D Materials, 1, 1-11.*
Wu, S. et al., "Monolayer semiconductor nanocavity lasers with ultralow thresholds" Nature (Apr. 2015) pp. 69-76, vol. 520.
Salehzadeh, O. et al., "Optically Pumped Two-Dimensional MoS2 Lasers Operating at Room-Temperature" Nano Letters (Jul. 2015) pp. 5302-5306, vol. 15.

* cited by examiner

*Primary Examiner* — Michael Carter
(74) *Attorney, Agent, or Firm* — Tutunjian & Bitetto, P.C.; Louis J. Percello

(57) ABSTRACT

A laser structure includes a substrate and a first dielectric layer formed on the substrate. A multi-quantum well is formed on the first dielectric layer and has a plurality of alternating layers. The alternating layers include a dielectric layer having a sub-wavelength thickness and a monolayer of a two dimensional material.

20 Claims, 5 Drawing Sheets

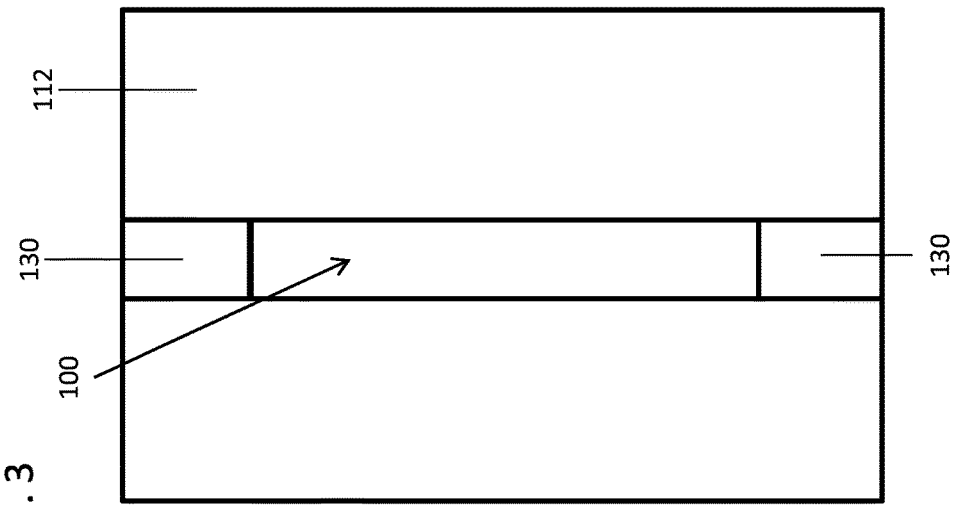
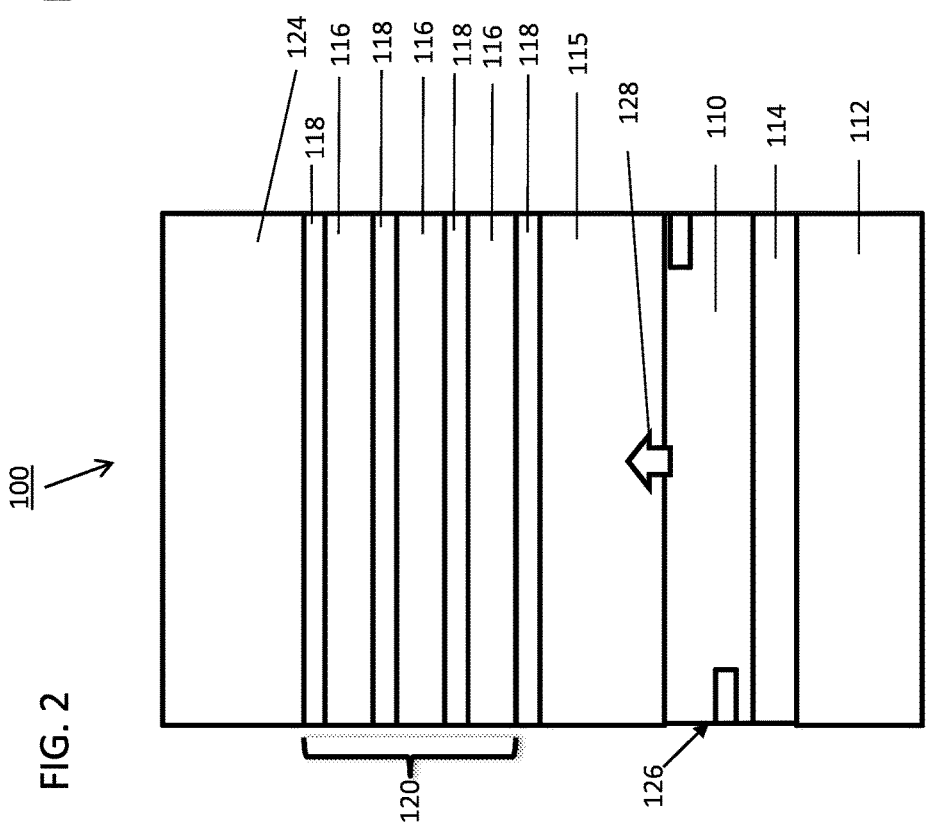

LASER ON SILICON MADE WITH 2D MATERIAL GAIN MEDIUM

BACKGROUND

Technical Field

The present invention relates to lasers, and more particularly to a Si integrated laser that is optically pumped by a light emitting diode and employs two-dimensional materials as a gain medium.

Description of the Related Art

Many high frequency and high performance devices are employed using III-V materials, such as GaAs. However, forming substrates from these materials tends to be more expensive than employing Si wafers and Si processing techniques. The cost of substrates becomes a bottleneck to the wide scale adoption of the substrate material for these high performance discrete devices. In addition, conventional substrates, such as sapphire and silicon carbide are expensive and have limited availability in larger diameters (i.e., these are typically limited to 4-inch substrates).

Silicon remains more moderate in cost and can provide larger diameter substrates; however, issues remain for employing Si. For example, large lattice and thermal expansion mismatches exist between Si and laser materials (e.g., GaAs) and anti-phase domains exist. A more significant challenge for III-V materials for a laser on Si includes defect growth and defect reactions during lasing.

SUMMARY

In accordance with an embodiment of the present principles, a laser structure includes a substrate and a first dielectric layer formed on the substrate. A multi-quantum well is formed on the first dielectric layer and has a plurality of alternating layers. The alternating layers include a dielectric layer having a sub-wavelength thickness and a monolayer of a two dimensional material.

Another laser structure includes a silicon substrate, a buffer layer formed on the silicon substrate and a light emitting diode (LED) formed on the buffer layer. A first dielectric layer is formed on the LED. A multi-quantum well is formed on the first dielectric layer and having a plurality of alternating layers. The alternating layers include a dielectric layer having a sub-wavelength thickness; and a monolayer of a two dimensional material.

A method for forming a laser structure includes forming a buffer layer on a silicon substrate; forming a light emitting diode (LED) on the buffer layer from III-V materials; forming a dielectric layer on the LED; stretching a monolayer of a two dimensional material on the dielectric layer; forming a next dielectric layer on the monolayer of the two dimensional material; and repeating formation of alternating monolayers of the two dimensional material and the dielectric layers to form a multi-quantum well laser.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 2 is a cross-sectional view showing a laser having a light emitting diode pump and a multi-quantum well arrangement (edge emitter) with a 2D material gain medium in accordance with the present principles;

FIG. 3 is a top view showing the laser of FIG. 2 with a dielectric waveguide formed on a substrate in accordance with one embodiment of the present principles;

DETAILED DESCRIPTION

Figure 1:
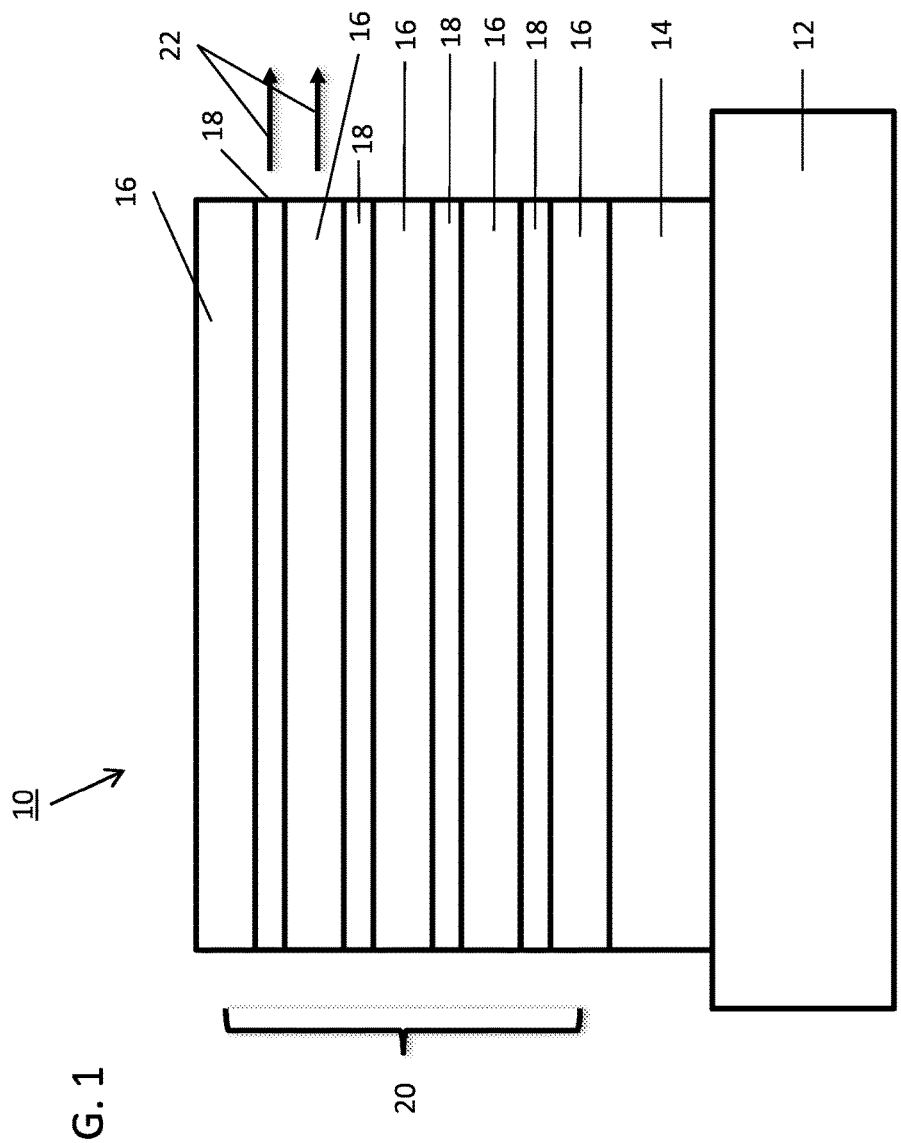
FIG. 1 is a cross-sectional view showing a laser made with a 2D material gain medium in a multi-quantum well arrangement in accordance with the present principles.

In accordance with the present principles, a nanolaser device is provided in accordance with the present principles. The laser includes a multi-quantum well arrangement with alternating layers of dielectric and two-dimensional (2D) materials. The laser may include a light pump fabricated from III-V materials to gain the performance benefits of these materials, while being formed on a monocrystalline silicon substrate to gain the processing benefits of silicon materials. One difficulty with this combination of materials is that defects occur as a result of lattice mismatches, among other things. In one embodiment, lattice mismatch is reduced using one or more buffer layers.

In one embodiment, the nanolasers include monolayers of 2D materials. The nanolasers may employ the optical pump to increase their output. The optical pump may be provided by a light emitting diode (LED). In a particularly useful embodiment, the LED can be integrated with the laser. In this way, efficiency and power are maximized. In addition, a compact and powerful laser can be integrated into integrated circuit (IC) devices and may include on-chip lasing applications.

In one embodiment, monolayers of 2D materials are employed in a quantum stack between dielectric materials. In one embodiment, the 2D material includes a monolayer transition metal dichalcogenide laser formed on the LED. The monolayer transition metal dichalcogenide may include $WSe_2$, although other materials may be employed. The LED may include III-V materials, although other materials may also be employed. The III-V materials are preferably formed on a Si substrate and include a buffer layer between the Si substrate and the III-V materials of the LED.

In one illustrative embodiment, the nanolaser employs III-V material(s) such as e.g., GaAs/AlGaAs, InP/InGaAsP, etc. These materials are grown directly on a buffer layer on the Si substrate using epitaxial growth processes, e.g., molecular beam epitaxy (MBE) or metal organic chemical vapor deposition (MOCVD). Appropriate buffer layers may be employed, as needed, between Si and III-V materials to reduce defect density. The less the defect density, the larger the laser can be made defect free (or the number of defect free lasers in a set of lasers).

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe, GaAs, etc. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a laser structure 10 shows an active region of a multi-quantum well laser 20 in accordance with one illustrative embodiment. The laser 20 includes multiple alternating layers with thicknesses configured to cause optical gain for lasing. The layers 16 include a non-conducting material, such as e.g., a dielectric material or in some cases a semiconductor material. The layers 16 may include a thickness of about 10 nm (e.g., between about 8 to 12 nm depending on the wavelength of light). In one particularly useful embodiment, the layers 16 include silicon dioxide. Layers 18 include a 2D material such as, e.g., $WSe_2$ or $MoS_2$, although other materials may be employed. For example, the 2D materials may include a chemical formula of $MX_2$, where M is a metal, and X is a non-metal. In particularly useful embodiments, M is W or Mo, and X is S, Se or Te. In one particularly useful embodiment, the laser 20 includes a single layer (monolayer) of $WSe_2$ for each layer 18. The $WSe_2$ laser 20 includes a low threshold (e.g., 100 mW/sq. mm).

The layers 18 may include a one or more monolayers of the 2D material. The number of layers 16, 18 may vary as needed or desired. In particularly useful embodiments, the number of layers 16, 18 may be, e.g., between 4 to 200, although other numbers of layers may also be employed.

2D materials are normally difficult to handle. However, in accordance with the present principles, a transfer process may be employed to transfer the 2D materials of layers 18 to dielectric layers 16. The 2D material provides a high conversion efficiency for laser output and can be more easily transferred to dielectric materials (layers 16). In addition, the 2D materials of layers 18 provide a low lasing threshold, e.g., down to about 27 nW. The present laser structure 10 avoids the drawbacks associated with conventional nanolasers. The present principles avoid small gain volumes and low output levels by avoiding optical cavities with diffraction limited sizes and high Q cavities, which can introduce long photon lifetimes for direct modulation. The 2D material of layers 18 provides a gain medium for the laser 20.

The laser structure 10 includes a dielectric layer 14. The dielectric layer 14 includes a dielectric material although semiconductor materials may be employed. The dielectric layer 14 may include a thickness of about 500 nm although other thicknesses may be employed. The dielectric layer 14 is formed on a substrate 12. The substrate 12 may include any suitable material, but Si is preferred to take advantage of Si processing techniques.

The laser 20 includes sub-wavelength scale layers 16, 18 to provide stronger gain using the quantum well cavity enhancements and high conversion efficiency provided by the 2D material. The laser 20 permits easy integration with Si and Si processing. In the embodiment depicted, the laser 20 is an edge emitter, which provides light 22 from the device's edge. The laser structure 10 may include a total height of less than about one micron.

Referring to FIG. 2, a cross-sectional view of an optically pumped laser 100 is shown in accordance with one illustrative embodiment. The laser 100 is formed on a substrate 112. The substrate 112 may include any suitable monocrystalline material. In one particularly useful embodiment, the substrate 112 may include Ge or Si. While other materials may be employed, e.g., GaAs, etc., Ge and/or Si provide the most beneficial materials due to their availability and ease of manufacture. In other embodiments, the substrate 112 may include a semiconductor-on-insulator (SOI) structure. The SOI structure includes a base substrate, a buried dielectric layer (e.g., oxide) and a thinner semiconductor layer. The semiconductor layer may include Si (silicon-on-insulator) or Ge (germanium-on-insulator). Some advantages for employing silicon or germanium substrates 112 include the larger size (more chips per wafer), reduced cost over substrates made with other materials (e.g., III-V materials) and silicon or germanium substrates are compatible with common processing techniques and platforms.

A buffer layer 114 is grown on the substrate 112. The buffer layer 114 may include a monocrystalline structure. The buffer layer 114 may be epitaxially grown using ultra-high vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE), etc. Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

The buffer layer 114 being grown on the substrate 112 may include an interface material that attempts to minimize dislocation defects due to lattice mismatch between the substrate 112 and the buffer layer 114 materials. The materials for the buffer layer 114 may include, e.g., Ge, GaAs, AlGaAs, InP, InGaAs, GaN, GaP, or other III-V materials or combinations thereof. The buffer layer 114 bridges the lattice mismatch between adjacent materials layers.

Once the buffer layer 114 is formed, additional layers 110 may be formed on the buffer layer 114 to fabricate a light emitting diode 126. In one embodiment, III-V materials are grown on the buffer layer 114 to form the diode 126. The diode 126 may include AlGaAs, AlGaInP, AlGaNInP or other materials. The diode 126 includes n and p doped active regions to form a p-n junction or junctions. The buffer layer 114 and the layers forming the diode 126 may be patterned in a single lithographic processing step.

It should be understood that a plurality of different diode structures may be employed for the diode 126. In particularly useful embodiments, a TS-LED (transparent substrate) may be employed, although other types of diodes may be employed, e.g., ODR-LED (omni-direction reflector), DBR-LED (distributed Bragg reflector), etc. The diode 126 needs to achieve a threshold pump power to be useful as an optical pump. In one embodiment, the threshold power needed to achieve the pump threshold is, e.g., about 100 mW/mm$^2$. An AlGaInP (or AlGaAs) TS-LED (126) can achieve this threshold power (e.g., 100 mW/mm$^2$) at room temperature (e.g., 300K).

In one embodiment, LED 126 provides a 25 mW output using a 40 mA injection current over an area of 0.25 mm$^2$ to achieve the threshold pump power (e.g., 25 mW/0.25 mm$^2$=100 mW/mm$^2$). Other diode types may also be employed. In one embodiment, the LED provides a wavelength output of less than 740 nm to be compatible with some laser structures.

A laser active region 120 includes a multi-quantum well structure. The multi-quantum well structure may include a thickness of about 50 nm although other thicknesses may be employed. The region 120 includes multiple alternating layers 116, 118 with thicknesses configured to cause optical gain for lasing. The layers 116 include a non-conducting material, such as e.g., a dielectric material or in some cases a semiconductor material. The layers 116 may include a thickness of about 10 nm (e.g., between about 8 to 12 nm depending on the wavelength of light). In one particularly useful embodiment, the layers 116 include silicon dioxide. Layers 118 include a 2D material such as, e.g., WSe$_2$ or MoS$_2$, although other materials may be employed. The layers 118 may include a single monolayer of the 2D material. In some embodiments, the layers 118 may also include two or more monolayers of the 2D material. The number of layers may vary as needed or desired.

The first 2D material layer 118 is placed on a dielectric layer 115 that is thicker and transparent to light 128 generated by the LED 126. The last layer 118 of 2D material may be capped with a dielectric layer 124, which may include, e.g., silicon dioxide. The 2D material of layers 118 provides a gain medium for the laser 120. The laser 120 includes sub-wavelength scale (e.g., less than the lasing light wavelength) layers 116, 118 to provide stronger gain using the quantum well cavity enhancements and high conversion efficiency provided by the 2D material. The laser 120 permits easy integration with Si and Si processing. The laser 120 is an edge emitter, which provides light from the device's edge. The laser structure 100 may include a total height of less than two microns.

Referring to FIG. 3, a top view of the optically pumped laser 100 is shown in accordance with the illustrative embodiment. The optically pumped laser 100 is formed on the substrate 112 and is coupled to dielectric waveguides 130 to carry the light from the optically pumped laser 100. The dielectric waveguides 130 include a transparent material that is transparent to the operating wavelength (e.g., less than 740 nm) of the optically pumped laser 100. In one embodiment, the dielectric waveguides 130 include silicon dioxide, although other materials may be employed.

Figure 4:
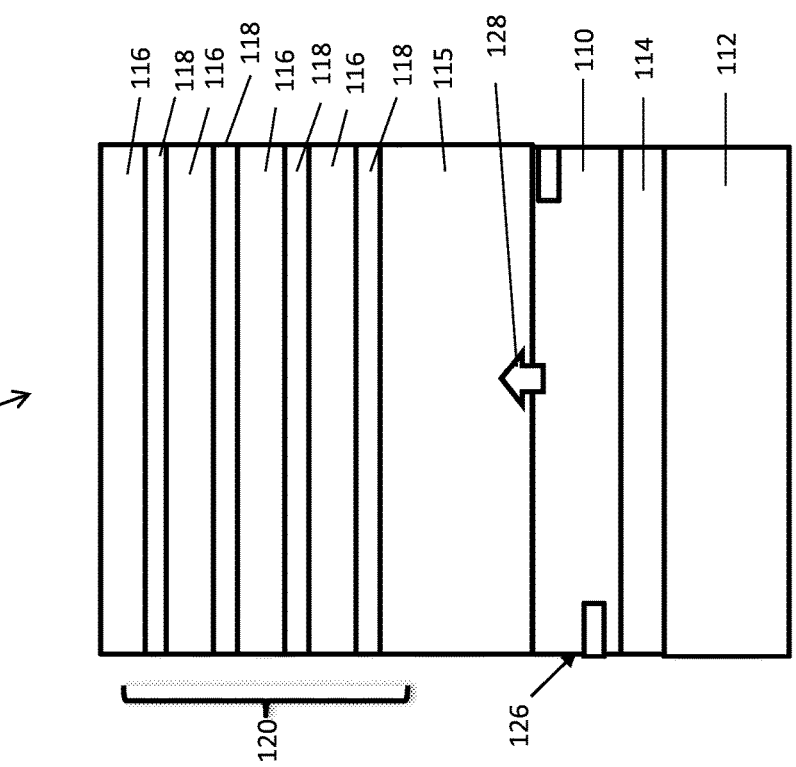
FIG. 4 is a cross-sectional view showing a laser having a light emitting diode pump and a multi-quantum well arrangement (disk laser) with a 2D material gain medium in accordance with the present principles.

Referring to FIG. 4, a cross-sectional view of another optically pumped laser 200 is shown in accordance with another illustrative embodiment. The laser 200 is formed on the substrate 112. The substrate 112 may include any suitable monocrystalline material. In one particularly useful embodiment, the substrate 112 may include Ge or Si. While other materials may be employed, e.g., GaAs, etc., Ge and/or Si provide the most beneficial materials due to their availability and ease of manufacture. In other embodiments, the substrate 112 may include a semiconductor-on-insulator (SOI) structure.

The buffer layer 114 is grown on the substrate 112. The buffer layer 114 may include a monocrystalline structure. The buffer layer 114 may be epitaxially grown. The buffer layer 114 being grown on the substrate 112 may include an interface material that attempts to minimize dislocation defects due to lattice mismatch between the substrate 112 and the buffer layer 114 materials. The materials for the buffer layer 114 may include, e.g., Ge, GaAs, AlGaAs, InP, InGaAs, GaN, GaP, or other III-V materials or combinations thereof.

Once the buffer layer 114 is formed, additional layers 110 may be formed on the buffer layer 114 to fabricate a light emitting diode 126. In one embodiment, III-V materials are grown on the buffer layer 114 to form the diode 126. The diode 126 may include AlGaAs, AlGaInP, AlGaNInP or other materials. The diode 126 includes n and p doped active regions to form a p-n junction or junctions. The buffer layer 114 and the layers forming the diode 126 may be patterned in a single lithographic processing step.

It should be understood that a plurality of different diode structures may be employed for the diode 126. In one embodiment, the LED provides a wavelength output of less than 740 nm to be compatible with some laser structures.

The laser active region 120 includes a multi-quantum well structure. The multi-quantum well structure may include a thickness of about 50 nm although other thicknesses may be employed. The region 120 includes multiple alternating layers 116, 118 with thicknesses configured to cause optical gain for lasing. The layers 116 include a non-conducting material, such as e.g., a dielectric material or in some cases a semiconductor material. Layers 118 include a 2D material such as, e.g., WSe$_2$ or MoS$_2$, although other materials may be employed. The layers 118 may include one or more monolayers of the 2D material with a single monolayer being preferred. The number of layers may vary as needed or desired.

The first 2D material layer 118 is placed on a dielectric layer 115 that is thicker and transparent to light 128 generated by the LED 126. The last layer 118 of 2D material may be capped with a dielectric layer 116. The 2D material of layers 118 provides a gain medium for the laser 120. The laser 120 includes sub-wavelength scale layers 116, 118 to provide stronger gain using the quantum well cavity enhancements and high conversion efficiency provided by the 2D material. The laser 120 permits easy integration with Si and Si processing. The laser 120 is an edge emitter, which provides light from the device's edge. The laser structure 200 may include a total height of less than two microns.

Figure 5:
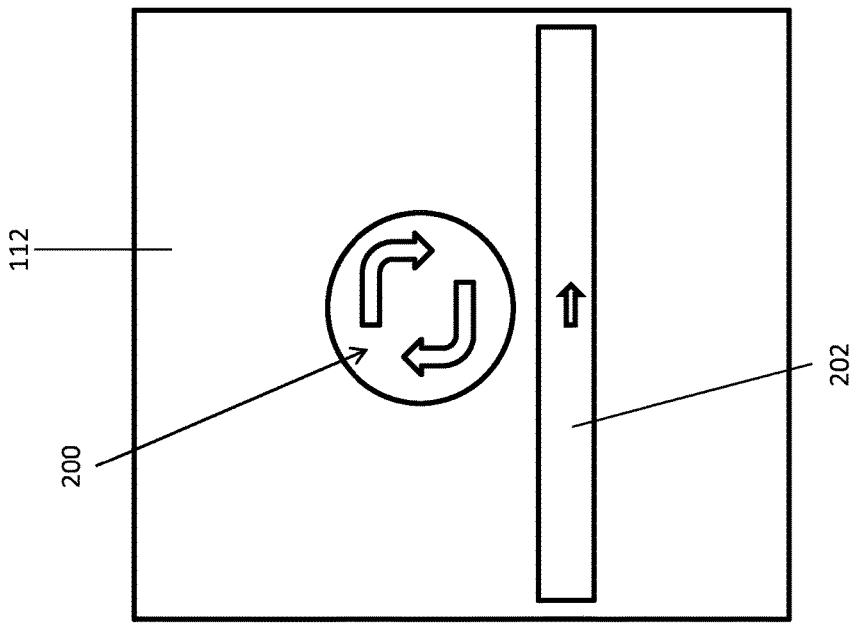
FIG. 5 is a top view showing the laser of FIG. 4 with a dielectric waveguide formed on a substrate in accordance with one embodiment of the present principles.

Referring to FIG. 5, a top view of the optically pumped laser 200 is shown in accordance with the illustrative embodiment. The optically pumped laser 200 may include a disk shape. The optically pumped laser 200 is formed on the substrate 112 and is coupled to an in-plane dielectric waveguide 202 to carry the light from the optically pumped laser 200. The dielectric waveguide 202 includes a transparent material that is transparent to the operating wavelength (less than 740 nm) of the optically pumped laser 200. In one embodiment, the dielectric waveguide 202 includes silicon dioxide, although other materials may be employed.

Figure 6:
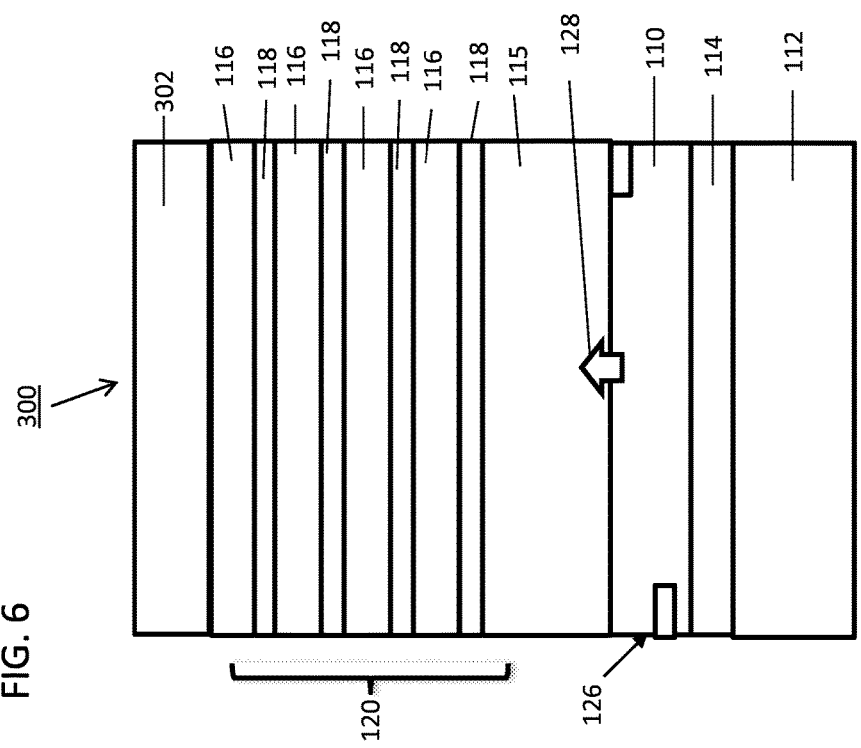
FIG. 6 is a cross-sectional view showing a laser having a light emitting diode pump and a multi-quantum well arrangement with a 2D material gain medium and a metal contact (plasmonic laser) in accordance with the present principles.

Referring to FIG. 6, a cross-sectional view of an optically pumped plasmonic laser 300 is shown in accordance with another illustrative embodiment. The laser 300 is formed on the substrate 112. The substrate 112 may include any suitable monocrystalline material. In one particularly useful embodiment, the substrate 112 may include Ge or Si. While other materials may be employed, e.g., GaAs, etc., Ge and/or Si provide the most beneficial materials due to their availability and ease of manufacture. In other embodiments, the substrate 112 may include a semiconductor-on-insulator (SOI) structure.

The buffer layer 114 is grown on the substrate 112. The buffer layer 114 may include a monocrystalline structure. The buffer layer 114 may be epitaxially grown. The buffer layer 114 being grown on the substrate 112 may include an interface material that attempts to minimize dislocation defects due to lattice mismatch between the substrate 112 and the buffer layer 114 materials. The materials for the buffer layer 114 may include, e.g., Ge, GaAs, AlGaAs, InP, InGaAs, GaN, GaP, or other III-V materials or combinations thereof.

Once the buffer layer 114 is formed, additional layers 110 may be formed on the buffer layer 114 to fabricate a light emitting diode 126. In one embodiment, III-V materials are grown on the buffer layer 114 to form the diode 126. The diode 126 may include AlGaAs, AlGaInP, AlGaNInP or other materials. The diode 126 includes n and p doped active regions to form a p-n junction or junctions. The buffer layer 114 and the layers forming the diode 126 may be patterned in a single lithographic processing step.

It should be understood that a plurality of different diode structures may be employed for the diode 126. In one embodiment, the LED provides a wavelength output of less than 740 nm to be compatible with some laser structures.

The laser active region 120 includes a multi-quantum well structure. The multi-quantum well structure may include a thickness of about 50 nm although other thicknesses may be employed. The region 120 includes multiple alternating layers 116, 118 with thicknesses configured to cause optical gain for lasing. The layers 116 include a non-conducting material, such as e.g., a dielectric material or in some cases a semiconductor material. Layers 118 include a 2D material such as, e.g., $WSe_2$ or $MoS_2$, although other materials may be employed. The layers 118 may include one or more monolayers of the 2D material with a single monolayer being preferred. The number of layers may vary as needed or desired.

The first 2D material layer 118 is placed on a dielectric layer 115 that is thicker and transparent to light 128 generated by the LED 126. The last layer 118 of 2D material may be capped with a dielectric layer 116. The 2D material of layers 118 provides a gain medium for the laser 120. The laser 120 includes sub-wavelength scale layers 116, 118 to provide stronger gain using the quantum well cavity enhancements and high conversion efficiency provided by the 2D material. The laser 120 permits easy integration with Si and Si processing. The laser 120 is an edge emitter, which provides light from the device's edge.

A metal contact 302 is deposited on the laser 120. The metal contact 302 may include, e.g., Ag, Au or other suitable metal. The metal contact 302 is excitable to generate plasmons to confine light by storing some of the light energy through electron oscillations called surface plasmon polaritons. The surface plasma excitations for a surface plasmon amplification by stimulated emission of radiation (spaser). The laser structure 300 may include a total height of less than two microns.

Figure 7:
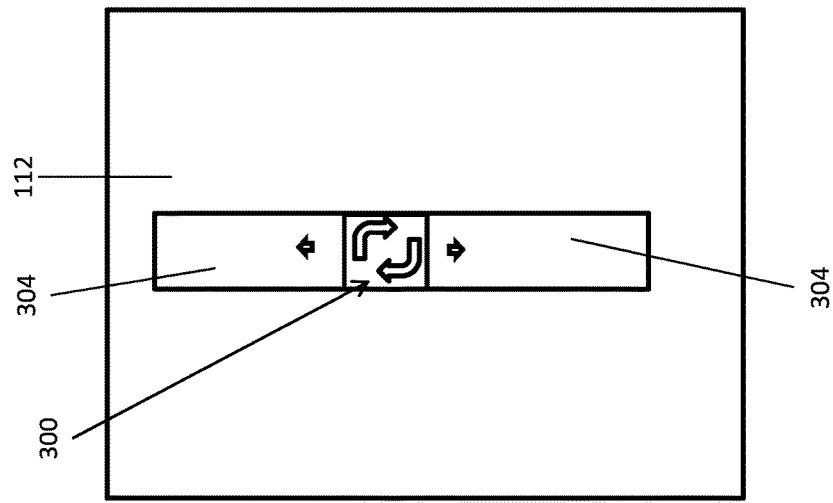
FIG. 7 is a top view showing the laser of FIG. 6 with a dielectric waveguide formed on a substrate in accordance with one embodiment of the present principles.

Referring to FIG. 7, a top view of the optically pumped plasmonic laser 300 is shown in accordance with the illustrative embodiment. The optically pumped plasmonic laser 300 is formed on the substrate 112 and is coupled to an in-plane dielectric waveguide 304 to carry the light from the optically pumped plasmonic laser 300. The dielectric waveguide 304 includes a transparent material that is transparent to the operating wavelength (less than 740 nm) of the optically pumped laser 300. In one embodiment, the dielectric waveguide 304 includes silicon dioxide, although other materials may be employed.

Figure 8:
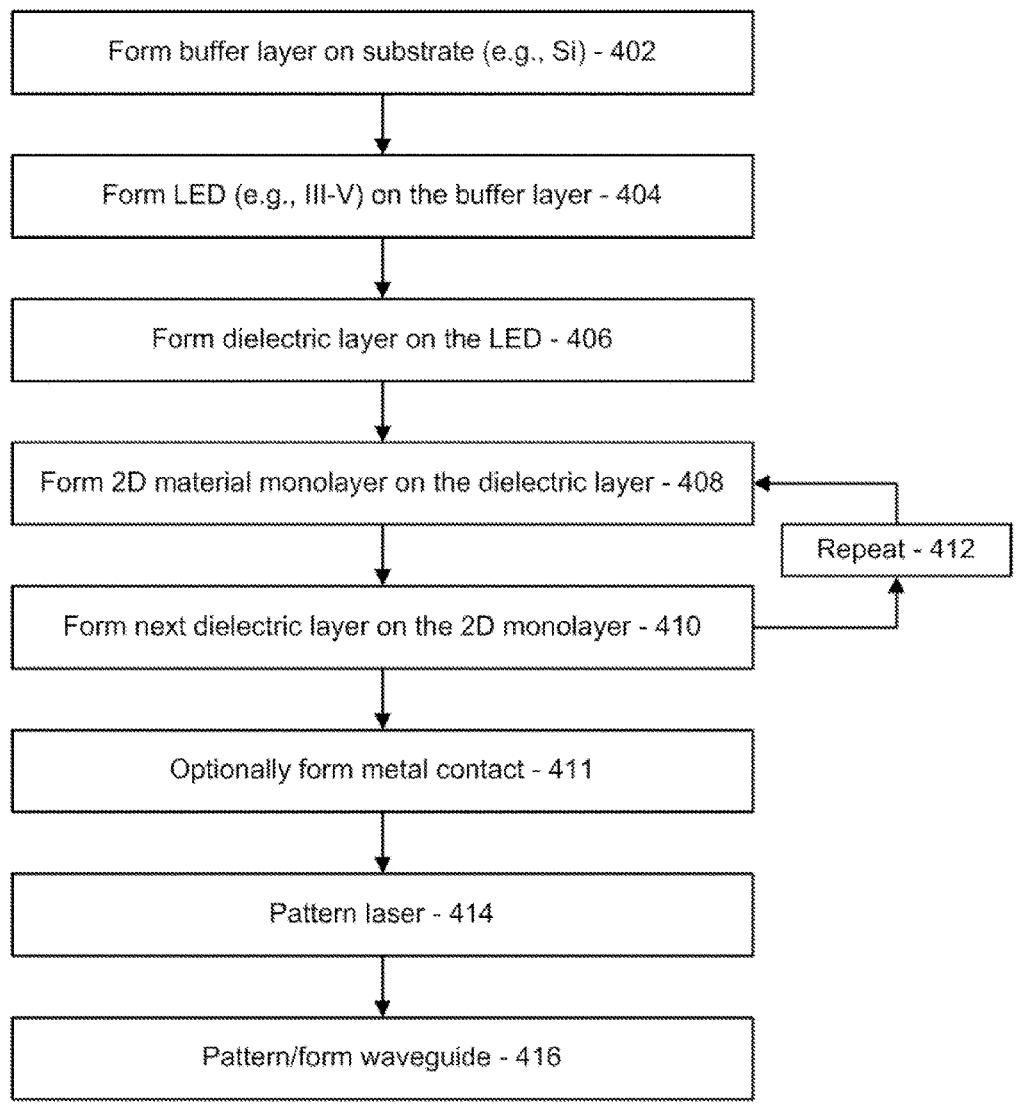
FIG. 8 is a block/flow diagram showing methods for fabricating a laser structure in accordance with the present principles.

Referring to FIG. 8, methods for forming a laser structure are illustratively shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 402, a buffer layer is formed on a Si (or Ge) substrate. The buffer layer may include a Ge material or any other suitable material to assist in lattice matching the substrate to materials included in subsequent layers. In block 404, in one embodiment, a light emitting diode (LED) may be formed on the buffer layer from III-V materials. In block 406, a dielectric layer is formed on the LED. The LED is employed as an optical pump for the subsequently formed quantum stack for a laser. It should be understood that in some embodiments, the following steps may be employed to form a multi-quantum stack employed in other devices or structures with or without an LED as an optical pump.

In block 408, a monolayer of a two dimensional material is stretched onto the dielectric layer. The two dimensional material includes a $MX_2$ wherein M may include W or Mo, and X is a nonmetal, which may include Se, Te and/or S.

Single layers of 2D material (e.g., $WSe_2$, $MoS_2$) may be exfoliated from crystals formed on a transfer substrate and moved by a transfer process using a scotch-tape micromechanical cleavage technique (e.g., similar to that employed for the production of graphene). In another case, one monolayer or a few monolayers may be first exfoliated on the transfer substrate, which may include a silicon substrate with a $SiO_2$ layer that has previously been coated with polyvinyl alcohol (PVA) and polymethyl methacrylate (PMMA). The PMMA film is released by dissolving PVA in water and transferred on top of the substrate with $SiO_2$ layers (e.g., layers 16, 116).

In block 410, a next dielectric layer (e.g., $SiO_2$) is formed on the first monolayer of the two dimensional material. In block 412, formation of alternating monolayers of the two dimensional material and the dielectric layers is repeated to form a multi-quantum well laser. In block 411, a metal contact may be formed on the multi-quantum well laser to form a plasmonic laser in some embodiments. The metal contact may include Ag, Au or similar metals.

In block 414, a patterning process may be performed using, e.g., lithography. The laser may be shaped as an edge emitter laser, a disk laser, etc. An etching process with lithography or other patterning process may be employed.

In block 416, a dielectric waveguide may be patterned or formed adjacent to the multi-quantum well laser on the substrate to guide light from the multi-quantum well laser. The dielectric waveguide may be patterned with the laser or formed separately. The dielectric waveguide may include one or more waveguides formed in-plane (or out-of-plane depending on the propagation of light) with the laser.

In block 418, a metal contact may be formed on the multi-quantum well laser to form a plasmonic laser. The metal contact may include Ag, Au or similar metals.

Having described preferred embodiments for a laser on silicon made with 2D material gain medium (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A laser structure, comprising:
   a monocrystalline substrate;
   a first dielectric layer formed on the substrate;
   a light emitting diode (LED) formed on the first dielectric layer wherein the LED acts as an optical pump;
   a multi-quantum well formed on the first dielectric layer having a plurality of alternating layers, the alternating layers including:
      a dielectric layer having a sub-wavelength thickness; and
      a monolayer of a two dimensional material.

2. The laser structure as cited in claim 1, wherein the two dimensional material includes a $MX_2$ wherein M is selected from the group consisting of W and Mo and X is a nonmetal.

3. The laser structure as recited in claim 1, wherein the two dimensional material includes a $MX_2$ wherein X is selected from the group consisting of Se, Te and S and M is a metal.

4. The laser structure as recited in claim 1, wherein the substrate includes Si and the LED includes a III-V material.

5. The laser structure as recited in claim 4, further comprising, a monocrystalline buffer layer formed between the Si substrate and the III-V material of the LED.

6. The laser structure as recited in claim 1, further comprising, a metal contact formed on the multi-quantum well to form a plasmonic laser.

7. The laser structure as recited in claim 1, further comprising, an in-plane dielectric waveguide configured to couple light from the multi-quantum well.

8. A laser structure, comprising:
   a silicon substrate;
   a buffer layer formed on the silicon substrate;
   a light emitting diode (LED) formed on the buffer layer;
   a first dielectric layer formed on the LED; and
   a multi-quantum formed on the first dielectric layer and having a plurality of alternating layers, the alternating layers including:
      a dielectric layer having a sub-wavelength thickness; and
      a monolayer of a two dimensional material.

9. The laser structure as recited in claim 8, wherein the two dimensional material includes $MX_2$ wherein M is selected from the group consisting of W and Mo and X is a nonmetal.

10. The laser structure as recited in claim 8, wherein the two dimensional material includes $MX_2$ wherein X is selected from the group consisting of Se, Te and S and M is a metal.

11. The laser structure as recited in claim 8, wherein the LED includes a III-V material.

12. The laser structure as recited in claim 11, further comprising, a monocrystalline buffer layer formed between the Si substrate and the III-V material of the LED.

13. The laser structure as recited in claim 8, further comprising, a metal contact formed on the multi-quantum well to form a plasmonic laser.

14. The laser structure as recited in claim 8, further comprising, an in-plane dielectric waveguide configured to couple light from the multi-quantum well.

15. A method for forming a laser structure, comprising:
   forming a buffer layer on a silicon substrate;
   forming a light emitting diode (LED) on the buffer layer from III-V materials;
   forming a dielectric layer on the LED;
   stretching a monolayer of a two dimensional material on the dielectric layer;
   forming a next dielectric layer on the monolayer of the two dimensional material; and
   repeating formation of alternating monolayers of the two dimensional material and the dielectric layers to form a multi-quantum well laser.

16. The method as recited in claim 15, further comprising, forming a dielectric waveguide adjacent to the multi-quantum well laser on the substrate to guide light from the multi-quantum well laser.

17. The method as recited in claim 15, wherein stretching the monolayer of a two dimensional material includes transferring the monolayer from another substrate.

18. The method as recited in claim 15, wherein the two dimensional material includes a $MX_2$ wherein M is selected from the group consisting of W and Mo and X is a nonmetal selected from the group consisting of Se, Te and S.

19. The method as recited in claim 15, further comprising forming a metal contact on the multi-quantum well laser to form a plasmonic laser.

20. A laser structure, comprising:
   a substrate;
   a first dielectric layer formed on the substrate;
   a multi-quantum formed on the first dielectric layer having a plurality of alternating layers, the alternating layers including:
      a dielectric layer having a sub-wavelength thickness; and
      a monolayer of a two dimensional material; and
   a metal contact formed on the multi-quantum well to form a plasmonic laser.

* * * * *